(12) United States Patent
Krivokapic

(10) Patent No.: US 6,509,234 B1
(45) Date of Patent: Jan. 21, 2003

(54) METHOD OF FABRICATING AN ULTRA-THIN FULLY DEPLETED SOI DEVICE WITH T-SHAPED GATE

(75) Inventor: Zoran Krivokapic, Santa Clara, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/200,652

(22) Filed: Jul. 22, 2002

Related U.S. Application Data

(62) Division of application No. 10/081,104, filed on Feb. 21, 2002, now Pat. No. 6,452,229.

(51) Int. Cl.[7] ............. H01L 21/336; H01L 21/00; H01L 21/28
(52) U.S. Cl. ............. 438/270; 438/297; 438/303; 438/151; 438/572; 438/574; 438/576; 438/580
(58) Field of Search ................. 438/149, 151, 438/270, 297, 303, 572, 574, 575, 576, 579, 580, 581, 58

(56) References Cited

U.S. PATENT DOCUMENTS

| | | | |
|---|---|---|---|
| 5,358,885 A | * | 10/1994 | Oku et al. |
| 5,552,620 A | * | 9/1996 | Lu et al. |
| 5,567,966 A | | 10/1996 | Hwang |
| 6,013,553 A | | 1/2000 | Wallace et al. |
| 6,020,024 A | | 5/2000 | Wu |
| 6,060,749 A | | 5/2000 | Wu |
| 6,100,204 A | | 8/2000 | Gardner et al. |
| 6,127,216 A | * | 10/2000 | Yu |
| 6,127,699 A | * | 10/2000 | Ni et al. |
| 6,159,781 A | * | 12/2000 | Pan et al. |
| 6,333,229 B1 | * | 12/2001 | Furukawa et al. |
| 6,348,385 B1 | * | 2/2002 | Cha et al. |
| 6,452,229 B1 | * | 9/2002 | Krivokapic |

* cited by examiner

Primary Examiner—John F. Niebling
Assistant Examiner—Stanetta Isaac
(74) Attorney, Agent, or Firm—Renner, Otto, Boisselle & Sklar, LLP

(57) ABSTRACT

A method of forming a fully depleted semiconductor-on-insulator (SOI) field effect transistor (FET). The method includes forming a T-shaped gate electrode formed at least in part in a recess formed in a layer of semiconductor material and over a body region that is disposed between a source and a drain. The method includes spacing the gate electrode from the body by a gate dielectric made from a high-K material.

15 Claims, 5 Drawing Sheets

US 6,509,234 B1

METHOD OF FABRICATING AN ULTRA-THIN FULLY DEPLETED SOI DEVICE WITH T-SHAPED GATE

RELATED APPLICATION DATA

This application is a divisional of U.S. patent application Ser. No. 10/081,104 filed Feb. 21, 2002, now U.S. Pat. No. 6,432,229 the disclosure of which is herein incorporated by reference in its entirety.

TECHNICAL FIELD

The present invention relates generally to semiconductor devices and the fabrication thereof and, more particularly, to a semiconductor device having a thin body region and a high-K gate dielectric.

BACKGROUND

A pervasive trend in modern integrated circuit manufacture is to produce semiconductor devices, such as metal oxide semiconductor field effect transistors (MOSFETs), that are as small as possible. In a typical MOSFET, a source and a drain are formed in an active region of a semiconductor layer by implanting N-type or P-type impurities in the layer of semiconductor material. Disposed between the source and the drain is a channel (or body) region. Disposed above the body region is a gate electrode. The gate electrode and the body are spaced apart by a gate dielectric layer. It is noted that MOSFETs can be formed in bulk format (for example, the active region being formed in a silicon substrate) or in a semiconductor-on-insulator (SOI) format (for example, in a silicon film that is disposed on an insulating layer that is, in turn, disposed on a silicon substrate).

Although the fabrication of smaller transistors allows more transistors to be placed on a single monolithic substrate for the formation of relatively large circuit systems in a relatively small die area, this downscaling can result in a number of performance degrading effects. For example, certain materials, when used in a down-scaled device, may become electrically leaky and can cause reliability problems.

Accordingly, there exists a need in the art for semiconductor devices, such as MOSFETs, that have decreased size, enhanced performance and enhanced reliability. There also exists a need for corresponding fabrication techniques to make those semiconductor devices.

SUMMARY OF THE INVENTION

According to one aspect of the invention, a fully depleted semiconductor-on-insulator (SOI) field effect transistor (FET) is provided. The FET includes a layer of semiconductor material disposed over an insulating layer, the insulating layer disposed over a semiconductor substrate. A source and a drain are formed from the layer of semiconductor material. A body is formed from the layer of semiconductor material and disposed between the source and the drain. The layer of semiconductor material is etched such that a thickness of the body is less than a thickness of the source and the drain and such that a recess is formed in the layer of semiconductor material over the body. The FET also includes a T-shaped gate having a center region formed at least in part in the recess and a pair of upper arms extending laterally from the center region, the upper arms respectively extending toward a source side of the FET and a drain side of the FET. The arms are formed over a configuring layer and the gate defines a channel in the body. The gate includes a gate electrode spaced apart from the body by a gate dielectric made from a high-K material.

According to another aspect of the invention, a method of forming a fully depleted semiconductor-on-insulator (SOI) field effect transistor (FET) is provided.

The method includes providing a layer of semiconductor material, the layer of semiconductor material disposed over an insulating layer, and the insulating layer disposed over a semiconductor substrate; forming a dummy gate on the layer of semiconductor material; doping the layer of semiconductor material to form a source and a drain, and a body region between the source and the drain; forming a configuring layer over the dummy gate and extending laterally from the dummy gate over the layer of semiconductor material; patterning the configuring layer to provide a source side structural surface and a drain side structural surface; removing at least a portion of the dummy gate; etching the layer of semiconductor material to form a recess therein, the recess formed in at least the body region of the layer of semiconductor material such that a thickness of the body is less than a thickness of the source and the drain; and forming a T-shaped gate a having a center region formed at least in part in the recess and a first and a second upper arm extending laterally from the center region, the first upper arm extending toward a source side of the FET and disposed on the source side structural surface and the second upper arm extending toward a drain side of the FET and disposed on the drain side structural surface, the gate defining a channel in the body, and the gate including a gate electrode spaced apart from the body by a gate dielectric made from a high-K material.

BRIEF DESCRIPTION OF DRAWINGS

These and further features of the present invention will be apparent with reference to the following description and drawings, wherein.

DISCLOSURE OF INVENTION

Figure 1:
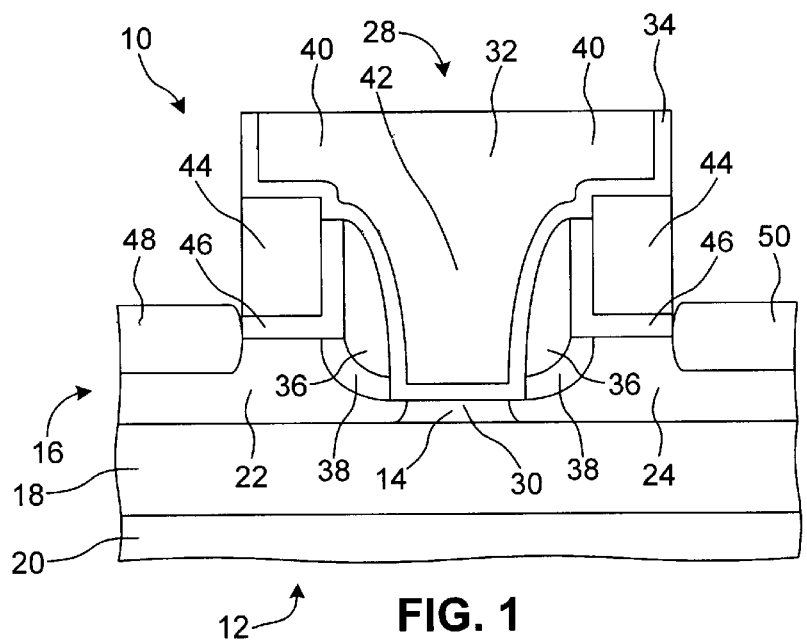
FIG. 1 is a schematic block diagram of an example semiconductor device formed in accordance with the present invention.

In the detailed description that follows, identical components have been given the same reference numerals, regardless of whether they are shown in different embodiments of the present invention. To illustrate the present invention in a clear and concise manner, the drawings may not necessarily be to scale and certain features may be shown in somewhat schematic form.

With reference to FIG. 1, a semiconductor device 10 fabricated on a wafer 12 according to an example embodiment of the present invention is illustrated. The illustrated semiconductor device 10 is a fully depleted, semiconductor-on-insulator (SOI), metal oxide semiconductor field effect transistor (MOSFET) used, for example, in the construction of a complimentary metal oxide semiconductor (CMOS) integrated circuit. The semiconductor device 10 has a body 14 having a thickness of less than about 50 Å. In one embodiment, the body 14 has a thickness of about 25 Å to about 50 Å.

As one skilled in the art will appreciate, the illustrated MOSFET is merely exemplary and the structures and the techniques for fabricating the semiconductor device 10 described herein can be used for other types of semiconductor devices (e.g., other types of transistors, memory cells, etc.). Although only one semiconductor device 10 is illustrated, one skilled in the art will appreciate that multiple semiconductor devices, of any type (including N-channel devices and P-channel devices), can be formed on the wafer 12.

The semiconductor device 10 is formed using a layer of semiconductor material 16. As illustrated, the layer of semiconductor material 16 can be a semiconductor film (for example, comprised of silicon, silicon-germanium, or the like) that is formed on a layer of insulating material 18 (for example, a buried oxide (BOX) layer). The insulating layer 18 is, in turn, formed on a semiconductor substrate 20 (also referred to in the art as a handle wafer) so that the resultant devices (e.g., semiconductor device 10) are formed in SOI format.

The semiconductor device 10 includes a source 22 and a drain 24. The body 14 is disposed between the source 22 and the drain 24. The source 22, the drain 24 and the body 14 are formed from the layer of semiconductor material 16 as will be described in greater detail below. In the illustrated embodiment, the body 24 is undoped, but the source 22 and the drain 24 are doped with an appropriate dopant (e.g., N+doping or P+doping). Alternatively, the body 14 can be doped as desired. Together, the source 22, the drain 24 and the body 14 form an active region 26. The active region 26 can be defined by isolation regions (not shown), such as shallow trench isolation (STI) regions as is well known in the art.

The source 22 and the drain 24 are relatively thick so as to have low parasitic resistance. In one embodiment, the thickness of the source 22 and the drain 24 is about 400 Å less an amount of semiconductor material consumed by silicidation as discussed below in greater detail. As indicated, the body is relatively thin (e.g., less than about 50 Å). A relatively thin body assists in controlling short channel effects (SCE). SCE generally occur when the gate does not have adequate control over the channel region, and can include threshold voltage ($V_t$) roll-off, off current (Ioff) roll-up and drain induced barrier lowering (DIBL). As the physical dimensions decrease, SCE can become more severe. SCE is the result of intrinsic properties of the crystalline materials used in the FET devices. Namely, the band gap and built-in potential at the source/body and drain/body junctions are non-scalable with the reduction of physical device dimensions, such as a reduction in channel length.

A gate 28 is disposed over the body 14 and defines a channel 30 within the body 14 (the channel 30 being interposed between the source 22 and the drain 24 and controlled by a work function of the gate 28). The gate 28 includes a gate electrode 32 spaced apart from the layer of semiconductor material 16 by a gate dielectric 34. As will be described in greater detail below, the gate 28 generally has a "T-shaped" configuration. In addition, the gate 28 is recessed into the layer of semiconductor material 16. That is, the layer of semiconductor material 16 has a recess in which the gate 28 is at least partially disposed. The recess is formed by removing a portion of the layer of semiconductor material 16 between the source 22 and the drain 24 such that the body 14 is formed with a relatively thin thickness (e.g., less than about 50 Å). As illustrated, portions of the source 22 and the drain 24 can be shaped by removal of a portion of the layer of semiconductor material 16 to effectively form extension regions of the source 22 and the drain 24.

The gate electrode 32 can be made from a metal (e.g., tungsten, tantalum, aluminum, nickel, ruthenium, rhodium, palladium, platinum, titanium, molybdenum, etc) or a metal containing compound (e.g., titanium nitride, tantalum nitride, ruthenium oxide, etc.). If desired, a doped semiconductor (e.g., polycrystalline silicon, polycrystalline silicon-germanium, etc.) could also be used for the gate electrode 32. The material of the gate electrode 32 can also be separately selected for N-channel devices and P-channel devices. By way of example, aluminum can be selected for an NMOS device and ruthenium or ruthenium oxide can be selected for PMOS devices.

Disposed adjacent each sidewall of the gate electrode 32 is a spacer 36. The spacers are separated from the gate electrode 32 by the gate dielectric 34. Such a configuration is a result of the spacers 36 being formed prior to the gate dielectric 34. The gate dielectric 34 is formed as a conformal layer over the spacers 36 and the body region 14, which is followed by formation of the gate electrode 32 as will be described in greater detail below. In one embodiment, the spacers 36 are formed from a nitride. Alternatively, the spacers could be formed from an oxide or an undoped semiconductor material, such as polycrystalline silicon.

In one embodiment, the gate dielectric 34 is made from a high-K material or a stack of materials to form a high-K dielectric stack. As used herein, a "high-K material" or a "high-K dielectric material" refers to a material, or stack of materials, having a relative permittivity in one embodiment of about ten (10) or more, and in another embodiment of about twenty (20) or more. Relative permittivity is the ratio of the absolute permittivity ($\epsilon$) found by measuring capacitance of the material to the permittivity of free space ($\epsilon_O$), that is $K=\epsilon/\epsilon_O$. High-K materials will be described in greater detail below. Although other materials can be selected for the gate dielectric 40, hafnium oxide (e.g., $HfO_2$), zirconium oxide (e.g., $ZrO_2$), cerium oxide ($CeO_2$), aluminum oxide (e.g., $Al_2O_3$), titanium oxide ($TiO_2$), yttrium oxide ($Y_2O_3$), barium strontium titanate (BST) are example suitable materials for the gate dielectric 34. In addition, all binary and ternary metal oxides and ferroelectric materials having a K higher than, in one embodiment, about twenty (20) can be used for the gate dielectric 34.

In an alternative embodiment, the gate dielectric 34 can be made from a standard-K material. As used herein, the term "standard-K material" or "standard-K dielectric material" refers to a dielectric material having a relative permittivity, or K, of up to about ten (10). Example standard-K materials include, for example, silicon dioxide (K of about 3.9), silicon oxynitride (K of about 4 to 8 depending on the relative content of oxygen and nitrogen) and silicon nitride (K of about 6 to 9).

When a high-K material is selected as the gate dielectric 34, the high-K material can have an equivalent oxide thickness (EOT) of about one nanometer (1 nm) or less. In the semiconductor device 10 described herein, a gate dielectric made from a high-K material may be desirable to minimize performance degrading effects, such as leakage, that may occur when the thickness of a standard-K dielectric material becomes thin (e.g., approaching about 1 nm). A high-K dielectric allows for the establishment of a suitable capacitance with a physically thicker dielectric layer. For example, a nitride gate dielectric having a K of about 7.8 and a thickness of about 10 nm is substantially electrically equivalent to an oxide gate dielectric having a K of about 3.9 and a thickness of about 5 nm. In addition, devices fabricated with a high-K dielectric layer tend to have improved reliability.

An oxide layer 38 (e.g., silicon oxide) can be disposed between the spacers 36 and the layer of semiconductor material 16. In the illustrated embodiment, the oxide layer 38 is formed between a source side spacer 36 and the source 22 and the oxide layer 38 is formed between a drain side spacer 36 and the drain 24. These oxide portions can be fabricated in separate processing steps or, as will be described in greater detail below, from one layer of material. In one embodiment, the oxide layer 38 is formed by consuming about 25 Å to about 50 Å of semiconductor material from the layer of semiconductor material 16.

When a high-K material is selected as the gate dielectric 34, a buffer interface (not shown) can be used between the layer of semiconductor material 16 and the gate dielectric 34. The buffer interface can be, for example, an oxide layer having a thickness of about 0.5 nm to about 0.7 nm. The buffer interface acts to reduce diffusion and/or penetration of atoms from the high-K dielectric material into the layer of semiconductor material 16 that could lead to a degradation in channel mobility. In addition, the buffer interface may act to retard reaction of the high-K material with the layer of semiconductor material 16. In one embodiment, the buffer interface can be formed from the same layer of material used to form the oxide layer 38.

As indicated above and as illustrated by example in FIG. 1, the gate 28 has a T-shape. The gate 28 includes upper arms 40 that extend laterally from a center region 42 of the gate 28. The arms 40 are formed over a configuring layer 44. As will be discussed in greater detail below, the configuring layer 44 is formed to assisting in defining the configuration of the gate 28. In one embodiment, the configuring layer 44 is made from a nitride (e.g., silicon nitride), although other appropriate materials can also be used. A liner 46 can be disposed between the configuring layer 44 and the layer of semiconductor material 16.

In one embodiment, the semiconductor device 10 is provided with a source contact 48 and a drain contact 50. The contacts 48, 50 can be made from a silicide. The silicide can be formed by reacting a metal (such as cobalt or nickel) with the layer of semiconductor material 16 to form, for example, $CoSi_2$ or NiSi.

Other components, such as a gate electrode 32 contact, a cap layer, vias, conductor lines and any other appropriate components to interconnect devices formed on the wafer 12, can also be provided.

Figure 2:
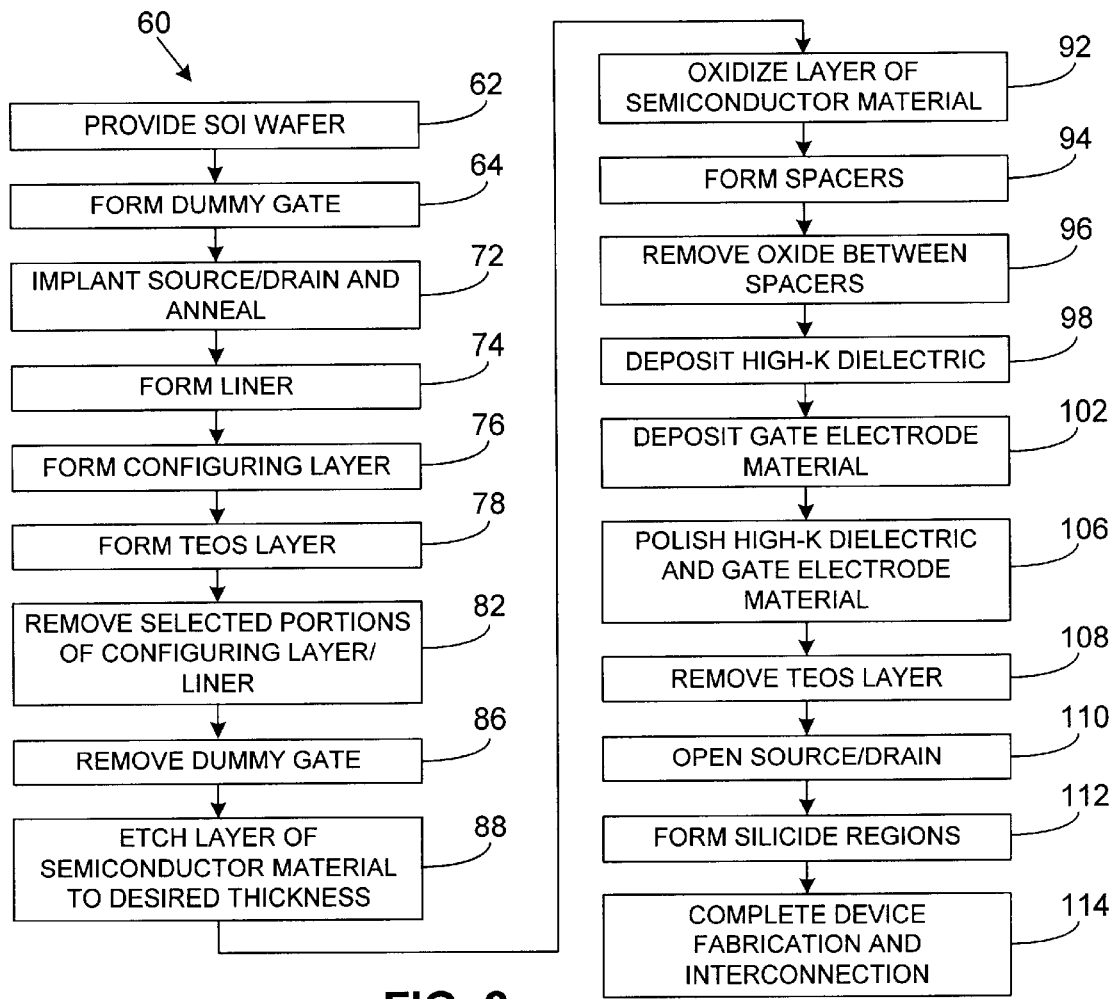
FIG. 2 is a flow chart illustrating a method of forming the semiconductor device of FIG. 1.
Figure 3A:
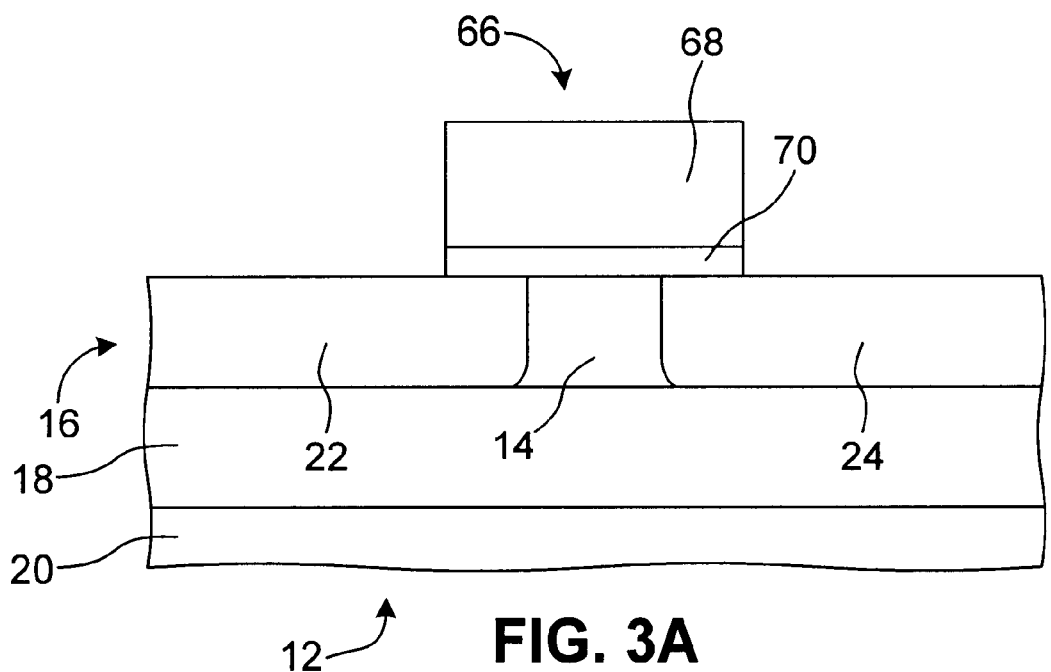
FIGS. 3A through 3E illustrate the semiconductor device of FIG. 1 in various stages of manufacture.

Referring now to FIG. 2, a method 60 of forming the semiconductor device 10 is illustrated. With additional reference to FIG. 3A, the method 60 starts in step 62 where the layer of semiconductor material 16 is provided. As indicated above, the layer of semiconductor material 16 can be a semiconductor film (such as a silicon film or a silicon-germanium film) formed as part of a SOI substrate stack. In such an arrangement, the layer of semiconductor material 16 is formed on the insulating layer 18, which is formed on the semiconductor substrate 20. In one embodiment, the layer of semiconductor material 16 can have a thickness of about 400 Å. The thickness of the layer of semiconductor material 16 will be selectively reduced to form the body region 14 as described below in greater detail. In one embodiment, the insulating layer 18 can have a thickness of about 500 Å.

If desired, isolation regions (not shown) can be formed in the layer of semiconductor material 16 to define the size and placement of multiple active regions 26 (FIG. 1) on the wafer 12. The formation of isolation regions, such as STI regions, are well known in the art and will not be described in greater detail.

Next, in step 64, a dummy gate 66 can be formed on the layer of semiconductor material 16. The dummy gate 66 can include, for example, an undoped polysilicon layer 68 formed over an oxide layer 70. However, one skilled in the art will appreciate that any other appropriate material or materials can be selected for the dummy gate 66 (e.g., nitrides, oxides, photoresist, etc). The oxide layer 70 can assist in matching material properties, such as stress parameters, between the polysilicon layer 68 and the layer of semiconductor material 16 during, for example, high temperature processing. The dummy gate 66 can be formed by convention processing, such as growing or depositing a layer (or layers) of the desired material(s) and patterning the layer(s) with an appropriate technique, such as photolithography.

Next, in step 72, the source 22 and the drain 24 can be doped by implanting an appropriate dopant species. Briefly, for a P-type source/drain, ions such as boron, gallium or indium can be implanted. For an N-type source/drain, ions such as antimony, phosphorous or arsenic can be implanted. In one embodiment of the invention, the semiconductor device 10 is configured as an N-channel device and the source 22 and the drain 24 are implanted with phosphorous with an energy of about 5 keV to 10 keV and a dose of about $2 \times 10^{15}$ atoms/cm$^2$ to about $4 \times 10^{15}$ atoms/cm$^2$. The ions used to form the source 22 and the drain 24 may diffuse under the dummy gate 66 is conventional. Following source/drain ion implantation, the wafer 12 can be annealed to activate the dopant species. For example, in the forgoing example where phosphorous has been implanted, the wafer 12 can be annealed at about 1000° C. for about 10 seconds.

Figure 3B:
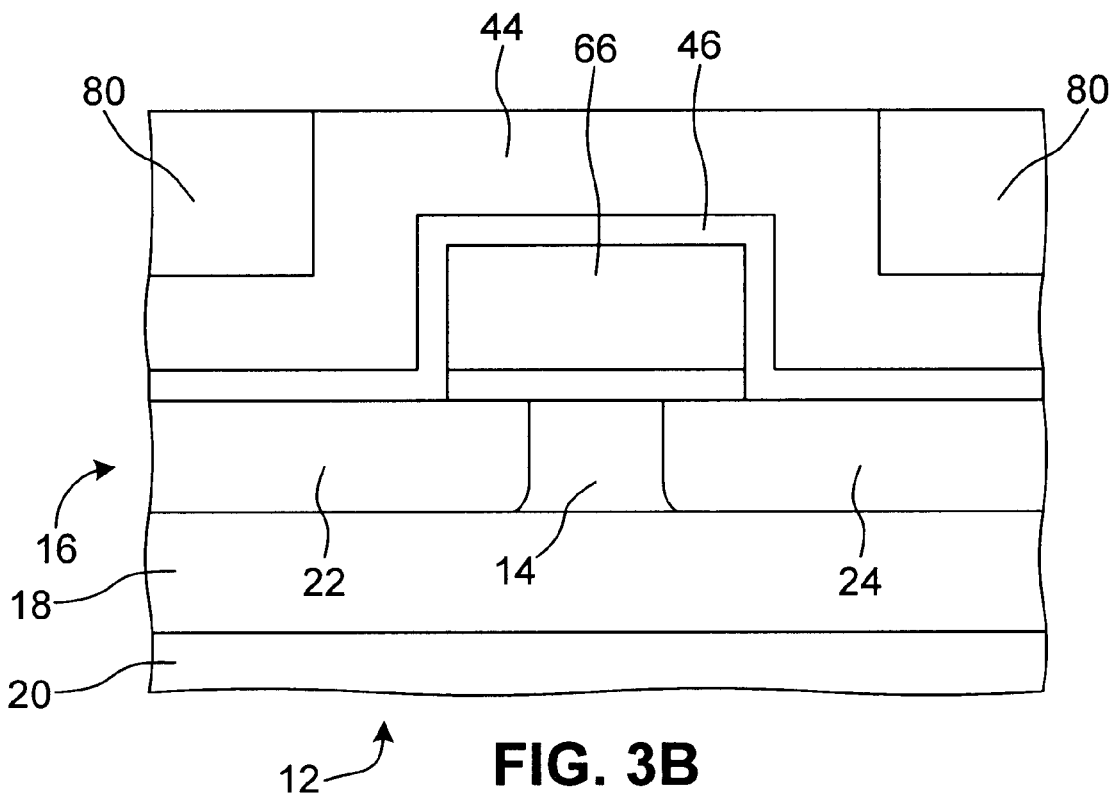

With additional reference to FIG. 3B, the method 60 continues in step 74 where the liner 46 is formed. The liner 46 is formed as a conformal layer over the dummy gate 66 and the layer of semiconductor material 16. The liner 46 can be formed from an oxide (e.g., silicon oxide) or other appropriate material and can have a thickness of about 50 Å. The liner 46 can assist in matching material properties, such as stress parameters, between the configuring layer 44 and the layer of semiconductor material 16 during, for example, high temperature processing. In addition, the liner 46 can allow for etching of the configuring layer 44 and/or spacers 36 while minimizing damage to the underlying layer of semiconductor material 16.

Thereafter, in step 76, the configuring layer 44 is formed. The configuring layer 44 can initially be formed as a conformal layer over the liner 46. Therefore, the conforming layer 44 initially is disposed over the dummy gate 66 and extends laterally from the dummy gate 66 over the layer of semiconductor material 16. In the illustrated embodiment, the configuring layer 44 is made from a nitride (e.g., silicon nitride) which is deposited over the liner 46 to a thickness of about 300 Å to about 500 Å. As will be described in greater detail below, the configuring layer 44 is patterned in subsequent processing to provide a structural surface upon which the arms 40 of the gate 28 can be formed.

The method 60 continues in step 78 where a tetraethyl-ortho-silicate (TEOS) oxide layer 80 can be formed over the configuring layer 44. The TEOS oxide layer 80 provides sidewalls to assist in the formation of the T-shaped gate as will be described in greater detail below. As one skilled in the art will appreciate, the layer 44 can be formed from a material source other than TEOS. The TEOS layer 44 can be formed to cover the configuring layer 44 and then polished back (using, for example, chemical mechanical planarization (CMP)) to have an upper surface that is generally even with an upper surface of a portion of the configuring layer 44 that is disposed over the dummy gate 66.

Figure 3C:
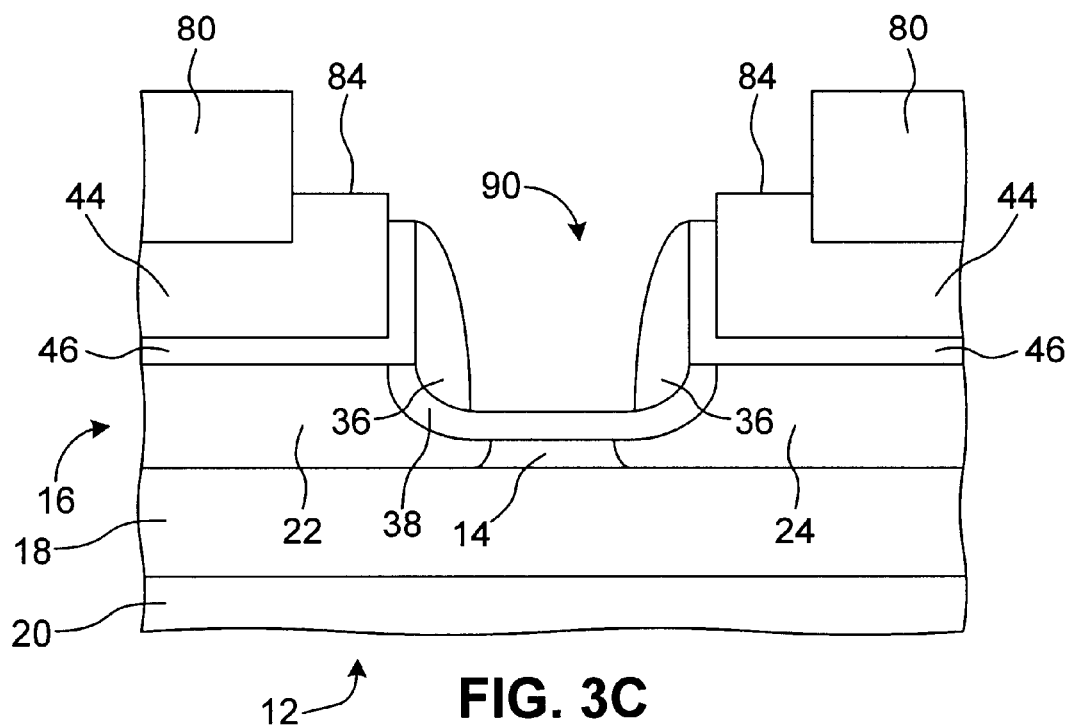

Next, in step 82 and with additional reference to FIG. 3C, a portion of the configuring layer 44 is removed to provide structural surfaces 84 upon which the arms 40 of the gate 28 can be formed. In the illustrated embodiment, about 600 Å of the configuring layer 44 can be removed. If nitride is selected as the material for the configuring layer, a hot phosphoric acid etch can be used to remove the undesired portion of the configuring layer 44.

Also in step 82, a portion of the liner 46 can be removed to remove oxide that is formed over the dummy gate 66. In one embodiment, portions of the liner 46 that become exposed after patterning of the conforming layer 44 can be removed by a hydrofluoric (HF) acid dip.

Thereafter, in step 86, the dummy gate 66 is removed. In the illustrated embodiment, the dummy gate 66 includes a layer 68 of polycrystalline silicon which can be removed using a reactive ion etch (RIE) etch carried out for about ten seconds to about twenty seconds. The dummy gate 66 can also include the underlying oxide layer 70 that can also be removed with an appropriate etch technique.

Thereafter, in step 88, the layer of semiconductor material 16 is etched to form a recess 90 in which the gate 28 will be formed as described below in greater detail. In the illustrated embodiment where the layer of semiconductor material 16 is formed from silicon, the layer of semiconductor material 16 can be etched using RIE so that about 50 Å to about 100 Å of silicon remains over the isolating layer 18 (e.g., an RIE carried out for about six seconds to about twelve seconds). Alternatively, wet chemical etching such as with ammonium hydroxide (e.g., NH$_4$OH) can be used. The amount of remaining semiconductor material will depend on the desired end thickness of the body region 14 following the completion of subsequent processing steps described below that may consume additional portions of the semiconductor material from the layer of semiconductor material 16. In the illustrated embodiment, the layer of semiconductor material 16 has an initial thickness of about 400Å. Therefore, in the illustrated embodiment, about 300 Å to about 350 Å of semiconductor material can be removed from the layer of semiconductor material 16.

Next, in step 92, the layer of semiconductor material 16 is oxidized to form the oxide layer 38. The oxide layer 38 is formed from exposed portions of the layer of semiconductor material 16 and extends from a portion of the liner 46 disposed over the source 22 to a portion of the liner 46 disposed over the drain 24. One reason for oxidizing the etched surface of the layer of semiconductor material 16 is to reduce the number of defects that may be caused by etching of the layer of semiconductor material 16.

In addition, oxidizing the layer of semiconductor material 16 is carried out to further reduced the amount of semiconductor material disposed over the insulating layer 18 in the area of the body 14. In the illustrated embodiment, the oxide layer 38 can be about 25 Å to about 50 Å thick. The oxide layer 38 can be formed, for example, by exposing the wafer to heat (e.g., about 800° C. to about 850° C.) in an oxygen containing atmosphere. The resulting thickness of the body 14 will enable the semiconductor device 10 to be fully depleted.

Figure 4:
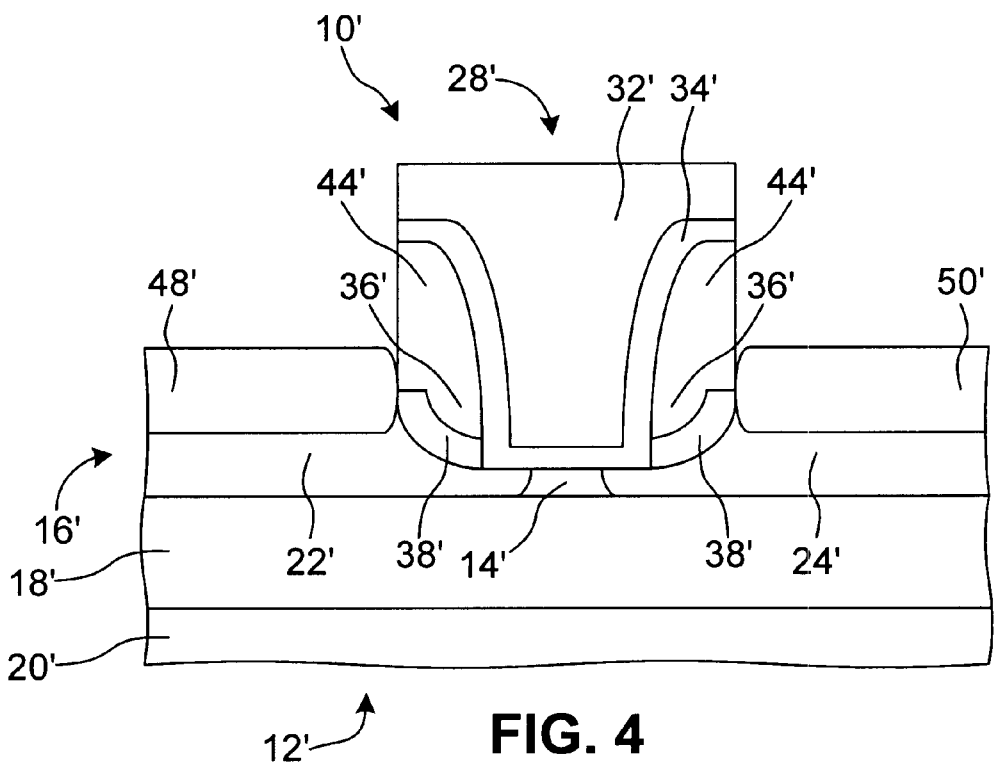
FIG. 4 is a schematic block diagram of another example semiconductor device formed in accordance with the present invention.

Next, in step 94, the spacers 36 are formed. The spacers 36 can be formed by depositing a layer of desired material to a thickness of about 100 Å to about 150 Å or, alternatively, to overfill the recess 90. In either case, such a deposited layer can conform to side walls of the liner 46. Alternatively, and as illustrated in FIG. 4, portions of the liner 46 that were disposed adjacent sidewalls of the dummy gate 66 can be removed in step 86 when the underlying oxide layer 70 was removed. In this alternative arrangement, the spacer material can be deposited adjacent side walls of the configuring layer 44.

In one embodiment, the material used for the spacers 36 is a nitride (e.g., silicon nitride). The deposited material can then be polished to have an upper surface generally even with the upper surface of the TEOS oxide layer 44. Next, the material can be anisotropically etched back to the oxide layer 38.

Figure 3D:
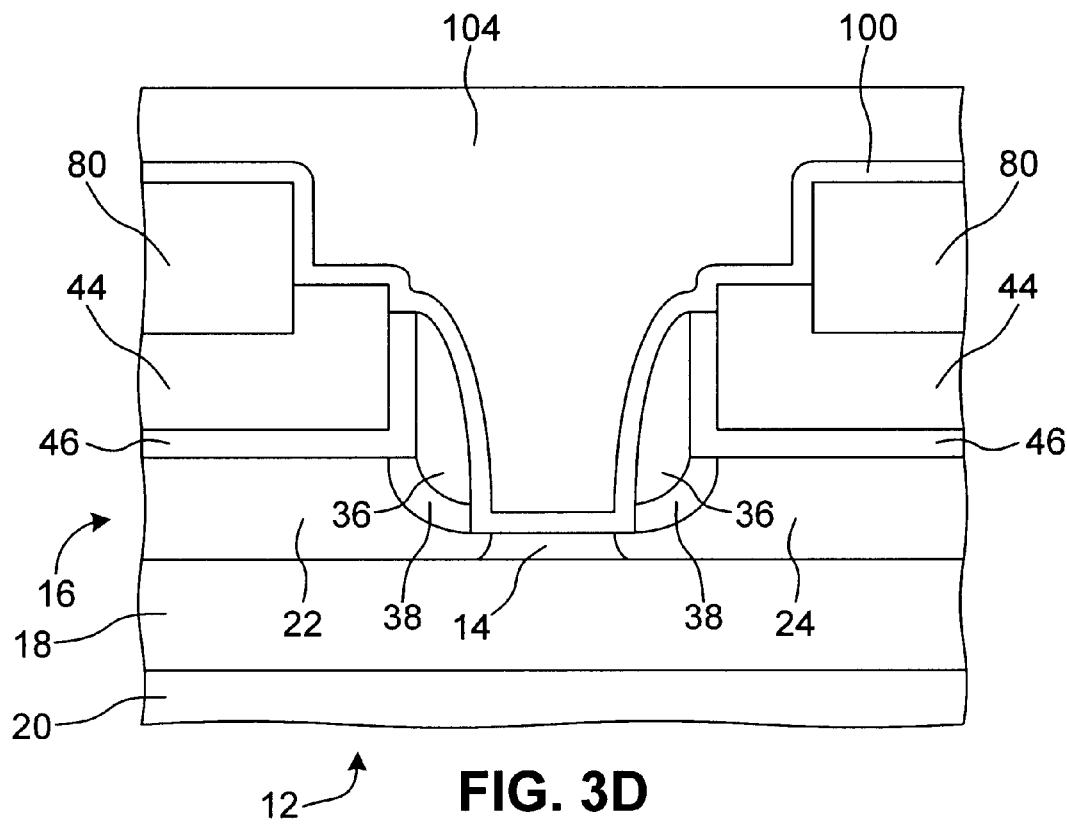

Thereafter, in step 96 and with additional reference to FIG. 3D, a portion of the oxide layer 38 formed between the spacers 36 can be removed, such as by wet chemical etching. Accordingly, the oxide layer 38 can be considered to be a sacrificial layer.

It is noted that the portion of the oxide layer 38 can alternatively be kept in place (and thinned, if desired) to serve as a buffer interface for the gate dielectric 34. In yet another alternative embodiment, the oxide layer 38 can be removed between the spacers 38 and replaced by another desired layer, including another oxide layer. The formation of another oxide layer can be used, for example, to finely tune the thickness of the body 14 and/or to form a buffer interface. In one example, the layer of semiconductor material 16 can be oxidized to consume additional semiconductor material, such as by a low temperature (about 500° C.) thermal oxidation process. In another example, oxide material can be deposited, such as by a remote plasma deposition process, an atomic layer deposition (ALD) process or the like. A deposited layer, in most circumstances, would be formed as a conformal layer such that oxide would also be formed on exposed surfaces of the TEOS layer 80, the configuring layer 66, the liner 46 and the spacers 36. Such oxide could be selectively removed or left in place.

Next, in step 98, a layer of high-K material 100 can be formed. The layer of high-K material 100 is used to form the gate dielectric 34. The layer of high-K material 100 can be deposited as a conformal layer over the layer 80, the layer 44, the spacers 36 and the exposed portion of the layer of semiconductor material 16 between the spacers 36 (or, if present, over a buffer interface formed between the spacers 36). Exemplary high-K materials are identified below in Table 1. It is noted that Table 1 is not an exhaustive list of high-K materials and other high-K materials may be available.

TABLE 1

| Dielectric Material | Approximate Relative Permittivity (K) |
|---|---|
| aluminum oxide (Al$_2$O$_3$) | 9–10 |
| zirconium silicate | 12 |
| hafnium silicate | 15 |
| hafnium silicon oxynitride | 16 |
| hafnium silicon nitride | 18 |
| lanthanum oxide (La$_2$O$_3$) | 20–30 |

TABLE 1-continued

| Dielectric Material | Approximate Relative Permittivity (K) |
|---|---|
| hafnium oxide (HfO$_2$) | 40 |
| zirconium oxide (ZrO$_2$) | 25 |
| cerium oxide (CeO$_2$) | 26 |
| bismuth silicon oxide (Bi$_4$Si$_2$O$_{12}$) | 35–75 |
| titanium dioxide (TiO$_2$) | 30 |
| tantalum oxide (Ta$_2$O$_5$) | 26 |
| tungsten oxide (WO$_3$) | 42 |
| yttrium oxide (Y$_2$O$_3$) | 20 |
| lanthanum aluminum oxide (LaAlO$_3$) | 25 |
| barium strontium titanate (Ba$_{1-x}$Sr$_x$TiO$_3$) | ~20—200 |
| barium strontium oxide (Ba$_{1-x}$Sr$_x$O$_3$) | ~20—200 |
| PbTiO$_3$ | ~20—200 |
| barium titanate (BaTiO$_3$) | ~20—200 |
| strontium titanate SrTiO$_3$ | ~20—200 |
| PbZrO$_3$ | ~20—200 |
| PST (PbSc$_x$Ta$_{1-x}$O$_3$) | 3000 |
| PZN (PbZn$_x$Nb$_{1-x}$O$_3$) | ~500—5000 |
| PZT (PbZr$_x$Ti$_{1-x}$O$_3$) | ~150—1000 |
| PMN (PbMg$_x$Nb$_{1-x}$O$_3$) | ~500—5000 |

It is noted that the K-values for both standard-K and high-K materials may vary to some degree depending on the exact nature of the dielectric material. Thus, for example, differences in purity, crystallinity and stoichiometry, may give rise to variations in the exact K-value determined for any particular dielectric material.

As used herein, when a material is referred to by a specific chemical name or formula, the material may include non-stoichiometric variations of the stoichiometrically exact formula identified by the chemical name. For example, tantalum oxide, when stoichiometrically exact, has the chemical formula Ta$_2$O$_5$, but may include variants of stoichiometric Ta$_2$O$_5$, which may be referred to as Ta$_x$O$_y$, in which either of x or y vary by a small amount. For example, in one embodiment, x may vary from about 1.5 to 2.5, and y may vary from about 4.5 to about 5.5. In another embodiment, x may vary from about 1.75 to 2.25, and y may vary from about 4 to about 6. Such variations from the exact stoichiometric formula fall within the definition of tantalum oxide. Similar variations from exact stoichiometry for all chemical names or formulas used herein are intended to fall within the scope of the present invention. For example, again using tantalum oxide, when the formula Ta$_2$O$_5$ is used, Ta$_x$O$_y$ is included within the meaning. Thus, in the present disclosure, exact stoichiometry is intended only when such is explicitly so stated. As will be understood by those of skill in the art, such variations may occur naturally, or may be sought and controlled by selection and control of the conditions under which materials are formed.

With continued reference to FIGS. 2 and 3D, the method 60 continues in step 102 where a layer of gate electrode material 104 is formed over the layer of high-K material 100. The gate electrode material 104 can be deposited by chemical vapor deposition (CVD). In one embodiment, the gate electrode material 104 is deposited to overfill the space between the TEOS layer 80. In the illustrated embodiment, the gate 28 has a length adjacent the body 14 such that the deposition of about 250 Å of gate electrode material 104 will fill the recess 90 and establish the T-shaped gate electrode 32 configuration. The use of CVD to deposit the layer of gate electrode material 82 is advantageous to minimize the introduction of additional interface charge.

A indicated above, the layer of gate electrode material 104 can be composed of a metal (e.g., tungsten, tantalum, aluminum, nickel, ruthenium, rhodium, palladium, platinum, titanium, molybdenum, etc) or a metal containing compound (e.g., titanium nitride, tantalum nitride, ruthenium oxide, etc.). If desired, a semiconductor (e.g., polycrystalline silicon, polycrystalline silicon-germanium, etc.) could also be used. The gate electrode material layer 104 can be selected for N-channel devices (e.g., tungsten, tantalum, aluminum, titanium nitride, tantalum nitride) or for P-channel devices (e.g., tungsten, nickel, ruthenium, rhodium, palladium, platinum, titanium nitride, tantalum nitride or ruthenium oxide).

Figure 3E:
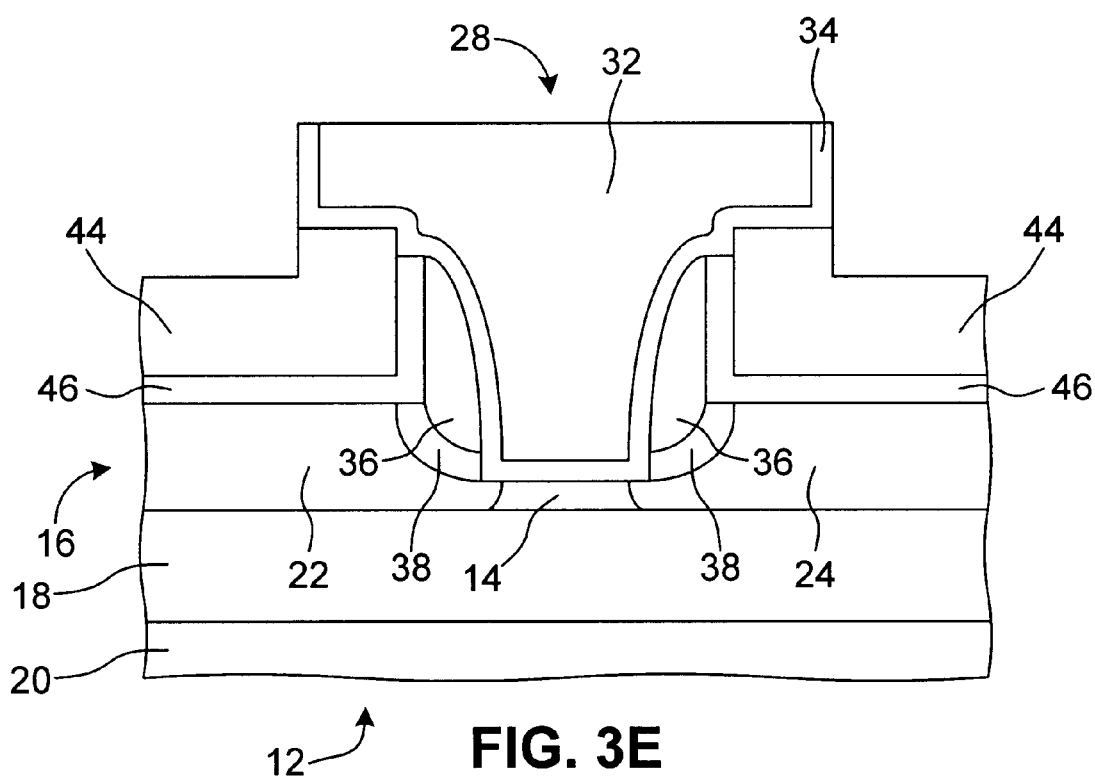

Thereafter, in step 106 and with additional reference to FIG. 3E, the layer of gate electrode material 104 and the layer of high-K material 100 can be polished (using, for example, CMP) to remove portions of the layer of gate electrode material 104 and the layer of high-K material 100 that are disposed over the layer 44. As illustrated, the layer 80 and the configuring layer 44 act to define the shape of an upper portion of the gate 28 to result in a T-shaped gate. Next, in step 108, the TEOS oxide layer 44 can be removed, such as by wet chemical etching in hydrofluoric (HF) acid.

Next, in step 110 and with reference back to FIG. 1, the source 22 and the drain 24 can be opened. Opening the source 22 and the drain 24 can include removing portions of the configuring layer 44 and the liner 46 extending laterally beyond the arms 40 of the gate 28 and exposed by removal of the TEOS layer 80. In the illustrated embodiment where the configuring layer 44 is made from a nitride, the configuring layer 44 and/or the liner 46 can be patterned in step 110 using RIE. Alternatively, wet chemical etching can be used to open the source 22 and the drain 24.

Next, in step 112, the source contact 48 and the drain contact 50 are formed. In the illustrated embodiment, the source contact 40 and the drain contact 50 are formed from silicide. Briefly, the silicide can be formed by depositing a layer of metal (such as cobalt, nickel, molybdenum or titanium) and reacting the metal with the layer of semiconductor material 16. Without intending to be bound by theory, it is believed that a quality high-K gate dielectric can be obtained if silicidation (or salicidation) of the source 22 and the drain 24 is carried out after gate 28 formation. In addition, possible contamination issues can be minimized (such contamination issues being specific to the materials and processing techniques used).

The method 60 can continue in step 114 where any additional processing to complete the formation of the semiconductor device 10 and to interconnect devices formed on the wafer 12 can be carried out. Such additional processing can include steps to form, for example, a cap layer, contact holes or vias, conductor runs and so forth.

The method 60 shows a specific order of steps for fabricating the semiconductor device 10. However, it is understood that the order may differ from that depicted. For example, the order of two or more steps may be altered relative to the order shown. Also, two or more steps may be carried out concurrently or with partial concurrence. In addition, various steps may be omitted and other steps may be added. Furthermore, the method 60 can be modified for the formation of devices other than the illustrated MOSFET. It is understood that all such variations are within the scope of the present invention.

With reference to FIG. 4, an alternative embodiment of the semiconductor device 10 (FIG. 1) is illustrated. It is noted that in FIG. 4, components of the semiconductor device 10' have been given the same reference numerals as counterpart components of the semiconductor device 10 illustrated in FIG. 1, but with a prime symbol (') added thereto. As indicated above, the semiconductor device 10' is made by removing portions of the liner 46 that were disposed adjacent the dummy gate 66 before formation of the spacers 38'. In the illustrated embodiment, the configuring layer 44 and the spacers 38' are each formed from a nitride and are thus shown without demarcation.

Figure 5:
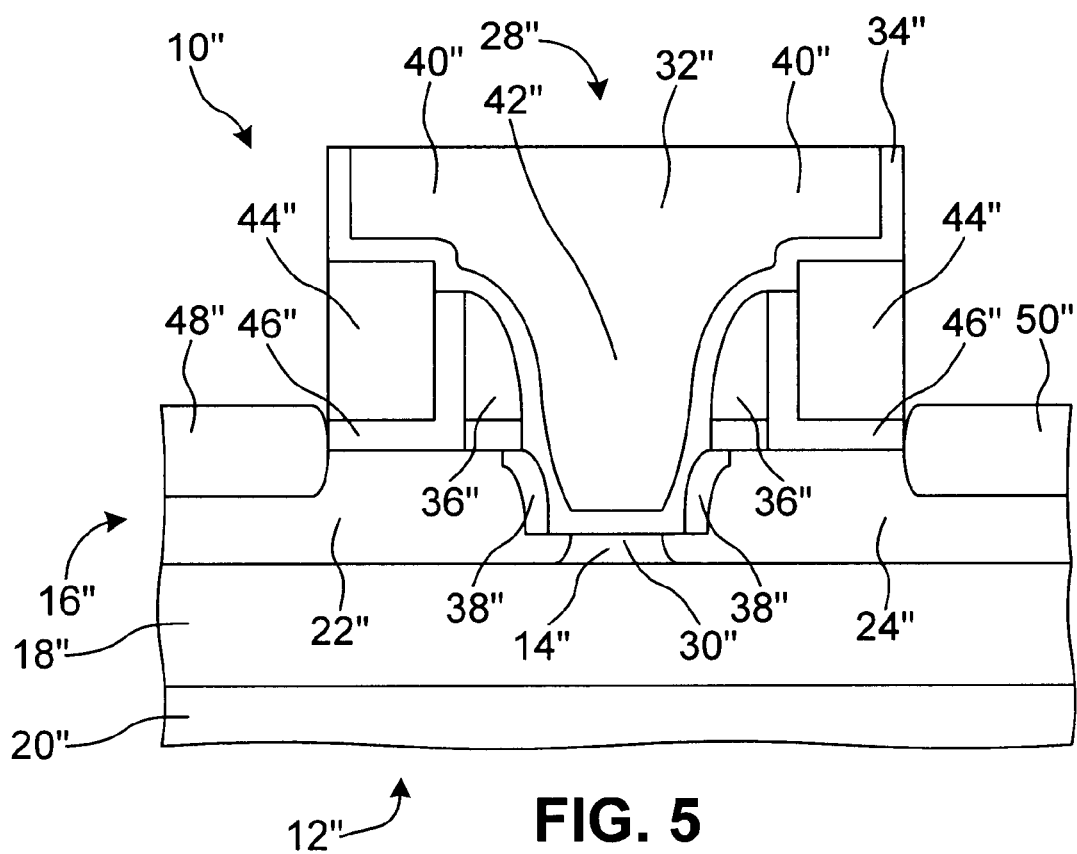
FIG. 5 is a schematic block diagram of yet another example semiconductor device formed in accordance with the present invention.

With reference to FIG. 5, another alternative embodiment of the semiconductor device 10 (FIG. 1) is illustrated. It is noted that in FIG. 5, components of the semiconductor device 10" have been given the same reference numerals as counterpart components of the semiconductor device 10 illustrated in FIG. 1, but with a double prime symbol (") added thereto. The semiconductor device 10" is made by variations to the method 60 where the spacers 36" are formed from the dummy gate 66 (FIGS. 3A and 3B) material and the layer of semiconductor material 16" is etched using a modified technique than that described in step 88 of method 60. One skilled in the art will appreciate that the modifications to the method 60 described below relate to modifications of steps 86 to 94. One skilled in the art will also appreciate that not all of the modifications to the method 60 described below need to be carried out together. For example, the spacers 36" can be formed using the modified technique and the etching of the layer of semiconductor material 16" can remain as described in method 60, or vice-versa.

As indicated, the spacers 36" are made from material of the dummy gate 66 and can include portions of the undoped polysilicon layer 68 and the oxide layer 70. Formation of the spacers 36" from the material of the dummy gate 66 can be accomplished by modifying step 86. For example, using reactive ion etching (RIE) the dummy gate 66 can be anisotropically etched to form the spacers 36". Thus, in the modified example, step 94 can be omitted.

As indicated, the techniques used to form the recess 90 in the layer of semiconductor material 16" can also be modified. Upon removal of the dummy gate 66, or upon removal of a portion of the dummy gate 66 to form the spacers 36", the layer of semiconductor material 16" can be anisotropically etched (using, for example, RIE) to reduce the thickness of the layer of semiconductor material 16". For example, if the layer of semiconductor material 16' has a beginning thickness of about 400 Å, then about 250 Å to about 300 Å or more of semiconductor material can be removed using RIE. Thereafter, wet etching (using, for example, ammonium hydroxide) can be used to remove an additional amount of semiconductor material (for example, about 50 Å to about 100 Å). Thereafter, the layer of semiconductor material 16" can be oxidized to form an oxide layer and to consume an additional amount of semiconductor material. The oxide layer is sacrificial and can be removed. In one embodiment, enough semiconductor material can be oxidized such that about 25 Å to about 50 Å of semiconductor material is left in place over the isolating layer 18" for use as the body 14"/channel 30". Without intending to be bound by theory, the foregoing method of forming the recess in the layer of semiconductor material 16" will assist in establishing a suitable interface between the gate dielectric 34" and the layer of semiconductor material 16". However, if desired, an oxide buffer interface can be used between the gate dielectric 34" and the layer of semiconductor material 16".

Although particular embodiments of the invention have been described in detail, it is understood that the invention is not limited correspondingly in scope, but includes all changes, modifications and equivalents coming within the spirit and terms of the claims appended hereto.

What is claimed is:

1. A method of forming a fully depleted semiconductor-on-insulator (SOI) field effect transistor (FET), comprising:

providing a layer of semiconductor material, the layer of semiconductor material disposed over an insulating layer, and the insulating layer disposed over a semiconductor substrate;

forming a dummy gate on the layer of semiconductor material;

doping the layer of semiconductor material to form a source and a drain, and a body region between the source and the drain;

forming a configuring layer over the dummy gate and extending laterally from the dummy gate over the layer of semiconductor material;

patterning the configuring layer to provide a source side structural surface and a drain side structural surface;

removing at least a portion of the dummy gate;

etching the layer of semiconductor material to form a recess therein, the recess formed in at least the body region of the layer of semiconductor material such that a thickness of the body is less than a thickness of the source and the drain; and forming a T-shaped gate a having a center region formed at least in part in the recess and a first and a second upper arm extending laterally from the center region, the first upper arm extending toward a source side of the FET and disposed on the source side structural surface and the second upper arm extending toward a drain side of the FET and disposed on the drain side structural surface, the gate defining a channel in the body, and the gate including a gate electrode spaced apart from the body by a gate dielectric made from a high-K material.

2. The method according to claim 1, wherein the body has a thickness of less than about 50 Å.

3. The method according to claim 1, further comprising oxidizing the etched portion of the layer of semiconductor material prior to formation of the gate.

4. The method according to claim 3, further comprising forming a spacer in each lateral side of the recess and over the an oxide layer formed by the oxidation step, the spacers formed prior to formation of the gate.

5. The method according to claim 4, wherein each spacer is formed from a nitride.

6. The method according to claim 4, further comprising removing a portion of the oxide layer between the spacers and wherein formation of the gate includes depositing a conformal layer of high-K material over the spacers and the body region of the layer of semiconductor material and depositing a layer of gate electrode material over the layer of high-K material.

7. The method according to claim 1, wherein removal of the at least a portion of the dummy gate results in the formation of spacers from the material of the dummy gate.

8. The method according to claim 1, wherein the gate electrode is formed from a metal containing material.

9. The method according to claim 1, further comprising forming a layer over the configuring layer to provide sidewalls that define lateral ends of the arms of the gate.

10. The method according to claim 1, further comprising forming a liner between the layer of semiconductor material and the configuring layer.

11. The method according to claim 1, further comprising siliciding the source and the drain to respectively form a source contact and a drain contact.

12. The method according to claim 11, wherein the source and the drain are silicided after formation of the high-K gate dielectric.

13. The method according to claim 1, wherein the high-K material of the gate dielectric is composed of one or more materials selected from hafnium oxide, zirconium oxide, cerium oxide, aluminum oxide, titanium oxide, yttrium oxide, barium strontium titanate and mixtures thereof.

14. The method according to claim 1, wherein etching of the layer of semiconductor material includes:

reactive ion etching to remove a first portion of the layer of semiconductor material;

wet etching to remove a second portion of the layer of semiconductor material; and oxidizing the layer of semiconductor material to consume a third portion of the layer of semiconductor material.

15. The method according to claim 1, wherein etching of the layer of semiconductor material includes:

reactive ion etching to remove a first portion of the layer of semiconductor material; and oxidizing the layer of semiconductor material to consume a second portion of the layer of semiconductor material.

* * * * *